(12) United States Patent
Nakamura et al.

(10) Patent No.: US 11,172,600 B2
(45) Date of Patent: Nov. 9, 2021

(54) MOUNTING DEVICE

(71) Applicant: SHINKAWA LTD., Tokyo (JP)

(72) Inventors: Tomonori Nakamura, Tokyo (JP); Toru Maeda, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 24 days.

(21) Appl. No.: 16/651,339

(22) PCT Filed: Sep. 19, 2018

(86) PCT No.: PCT/JP2018/034575
§ 371 (c)(1),
(2) Date: Jun. 9, 2020

(87) PCT Pub. No.: WO2019/065394
PCT Pub. Date: Apr. 4, 2019

(65) Prior Publication Data
US 2021/0251112 A1      Aug. 12, 2021

(30) Foreign Application Priority Data
Sep. 29, 2017   (JP) .............................. JP2017-190058

(51) Int. Cl.
*B23P 19/00* (2006.01)
*H05K 13/04* (2006.01)
(52) U.S. Cl.
CPC ..... *H05K 13/0409* (2018.08); *H05K 13/0417* (2013.01); *Y10T 29/53178* (2015.01)
(58) Field of Classification Search
CPC ............ H01L 2924/00; H01L 21/6838; Y10T 29/53191; Y10T 29/4913; Y10T 29/53174;
(Continued)

(56) References Cited

U.S. PATENT DOCUMENTS 8,450,150 B2 * 5/2013 Maki ...................... H01L 24/29
                                                        438/109
9,698,117 B2 * 7/2017 Ha .......................... H01L 24/75
(Continued)

FOREIGN PATENT DOCUMENTS

JP    H08210354    8/1996
JP    2002093826   3/2002
(Continued)

OTHER PUBLICATIONS

"Office Action of Taiwan Counterpart Application", dated Aug. 6, 2020, with English translation thereof, p. 1-p. 7.
(Continued)

*Primary Examiner* — Thiem D Phan
(74) *Attorney, Agent, or Firm* — JCIPRNET

(57) ABSTRACT

A semiconductor mounting device for mounting chip components on a substrate, wherein the device is reduced in size. A semiconductor mounting device 10 comprises: a temporary placement stage 12 on which are loaded a plurality of chip components 30a, 30b, 30c; a conveyance head 14 that conveys the chip components 30a, 30b, 30c to the temporary placement stage 12, and also loads each of the chip components 30a, 30b, 30c on the temporary placement stage 12 so that the relative positions of the plurality of chip components 30a, 30b, 30c reach predetermined positions; a mounting stage 16 that secures a substrate 36 by suction; and a mounting head 18 that suctions the plurality of chip components 30a, 30b, 30c loaded on the temporary placement stage 12, and pressurizes while keeping the relative positions at prescribed positions on the substrate 36 that is secured by suction to the mounting stage 16.

4 Claims, 5 Drawing Sheets

(58) Field of Classification Search
CPC ......... Y10T 29/53178; Y10T 29/53261; Y10T 483/1736; H05K 13/00; H05K 13/04
USPC .......... 29/740, 739, 741, 742, 743, 832, 834
See application file for complete search history.

(56) References Cited

U.S. PATENT DOCUMENTS

2010/0261312 A1 10/2010 Maki et al.
2017/0186635 A1 6/2017 Sekiya

FOREIGN PATENT DOCUMENTS

| JP | 2009200377 | 9/2009 |
| JP | 2017022326 | 1/2017 |
| TW | 201108336 | 3/2011 |
| TW | 201719773 | 6/2017 |
| TW | M543457 | 6/2017 |
| TW | 201732987 | 9/2017 |

OTHER PUBLICATIONS

"International Search Report (Form PCT/ISA/210) of PCT/JP2018/034575," dated Oct. 23, 2018, with English translation thereof, pp. 1-3.

* cited by examiner

MOUNTING DEVICE

CROSS-REFERENCE TO RELATED APPLICATION

This application is a 371 application of the International PCT application serial no. PCT/JP2018/034575, filed on Sep. 19, 2018, which claims the priority benefits of Japan Patent Application No. 2017-190058, filed on Sep. 29, 2017. The entirety of each of the above-mentioned patent applications is hereby incorporated by reference herein and made a part of this specification.

BACKGROUND

Technical Field

The present invention relates to a mounting device for mounting chip components, which are semiconductor elements, on a substrate.

Description of Related Art

A semiconductor mounting device has been used for performing flip chip bonding, which forms a bump on an electrode of a semiconductor element, inverts a chip component with a thermosetting resin film attached to a surface thereof, and pressurizes and heats a predetermined position on a circuit substrate so as to melt the bump to bond to an electrode of the substrate, and fills a thermosetting resin between the substrate and the semiconductor element (for example, see Patent Document 1).

In the semiconductor mounting device described in Patent Document 1, a bump is formed on the electrode, the chip component with a non-conductive film (NCF) of a thermosetting resin attached to the surface is inverted, the inverted chip component is picked up by a temporary pressure-bonding head and conveyed one by one onto the circuit substrate held on a temporary pressure-bonding stage, the chip component is heated by the temporary pressure-bonding head to a temperature at which the NCF does not start hardening, for example, about 100° C., to soften the NCF, and the chip component is temporarily bonded (temporarily pressure-bonded) to the circuit substrate.

When all the chip components are temporarily pressure-bonded to the circuit substrate, the circuit substrate is moved to a final pressure-bonding stage. In the final pressure-bonding stage, the circuit substrate is heated, and a plurality of chip components on the circuit substrate are simultaneously heated to a melting temperature of the bumps, for example, about 300° C., by the final pressure-bonding head and pressurized. Thus, the bumps are melted, and the NCF is softened and enters the gap between the chip components and the circuit substrate. When the temperature of the final pressure-bonding head is lowered after this state is maintained for a predetermined time, the molten bumps solidify and are electrically bonded to the circuit substrate, and the NCF hardens to secure each chip component to the circuit substrate.

RELATED ART

Patent Document

[Patent Document 1] Japanese Laid-Open No. 2017-22326

SUMMARY

Problems to be Solved

In the semiconductor mounting device described in Patent Document 1, since the final pressure bonding is performed by pressurizing and heating a plurality of chip components simultaneously, the chip components can be mounted in a shorter time compared with fully pressure-bonding the chip components one by one to the circuit substrate. However, as it is necessary to provide two stages, a temporary pressure-bonding stage large enough to hold the circuit substrate and a final pressure-bonding stage, the device becomes large in size.

The present invention reduces the size of a mounting device for mounting chip components on a circuit substrate.

Means for Solving the Problems

A mounting device of the present invention is a mounting device for mounting a chip component on a substrate. The mounting device includes: a temporary placement stage on which a plurality of the chip components are loaded; a conveyance head conveying the chip component to the temporary placement stage, and loading each chip component on the temporary placement stage so that relative positions of the plurality of chip components reach predetermined positions; a mounting stage securing the substrate by suction; and a mounting head suctioning a chip component set which is the plurality of chip components loaded on the temporary placement stage, and pressurizing and securing while keeping the relative positions at the predetermined positions on the substrate that is secured by suction to the mounting stage, wherein while the mounting head is securing the chip component set to the substrate, the conveyance head loads a plurality of the chip components constituting a chip component set which is scheduled to be secured to the substrate next on the temporary placement stage, and a number of the chip components constituting the chip component set is determined so that after the mounting head secures the chip component set to the substrate, while the mounting head moves toward the temporary placement stage in order to suction the chip component set scheduled to be secured next, loading of the chip component set on the temporary placement stage performed by the conveyance head is completed.

In the mounting device of the present invention, the temporary placement stage may have an upper surface vacuum-suctioning the chip component, the upper surface may be formed of a first porous member, and the first porous member may include suction holes at an interval shorter than a length of each side of the chip component loaded on the upper surface.

In the mounting device of the present invention, the mounting head may have a suction surface vacuum-suctioning the plurality of chip components, the suction surface may be formed of a second porous member, and the second porous member may include suction holes at an interval shorter than the length of each side of each chip component suctioned to the suction surface.

Effects

Since the mounting device of the present invention includes one stage for holding the substrate, the size of the device can be reduced.

DESCRIPTION OF THE EMBODIMENTS

Hereinafter, a semiconductor mounting device according to an embodiment of the present invention will be described with reference to the drawings. The semiconductor mounting device may be simply referred to as "mounting device".

Figure 1:
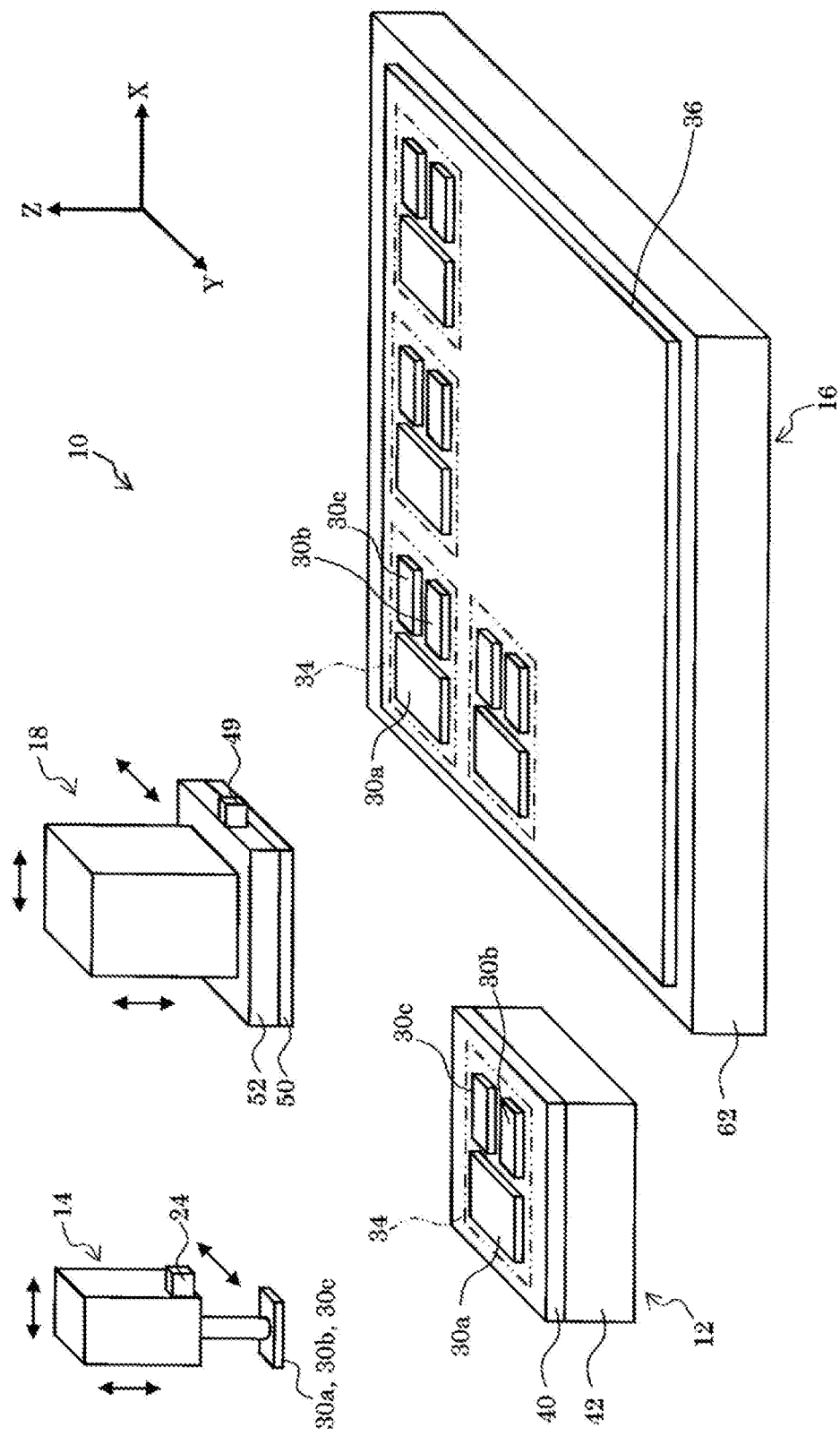
FIG. 1 is a schematic view showing an overall configuration of a semiconductor mounting device.
Figure 2:
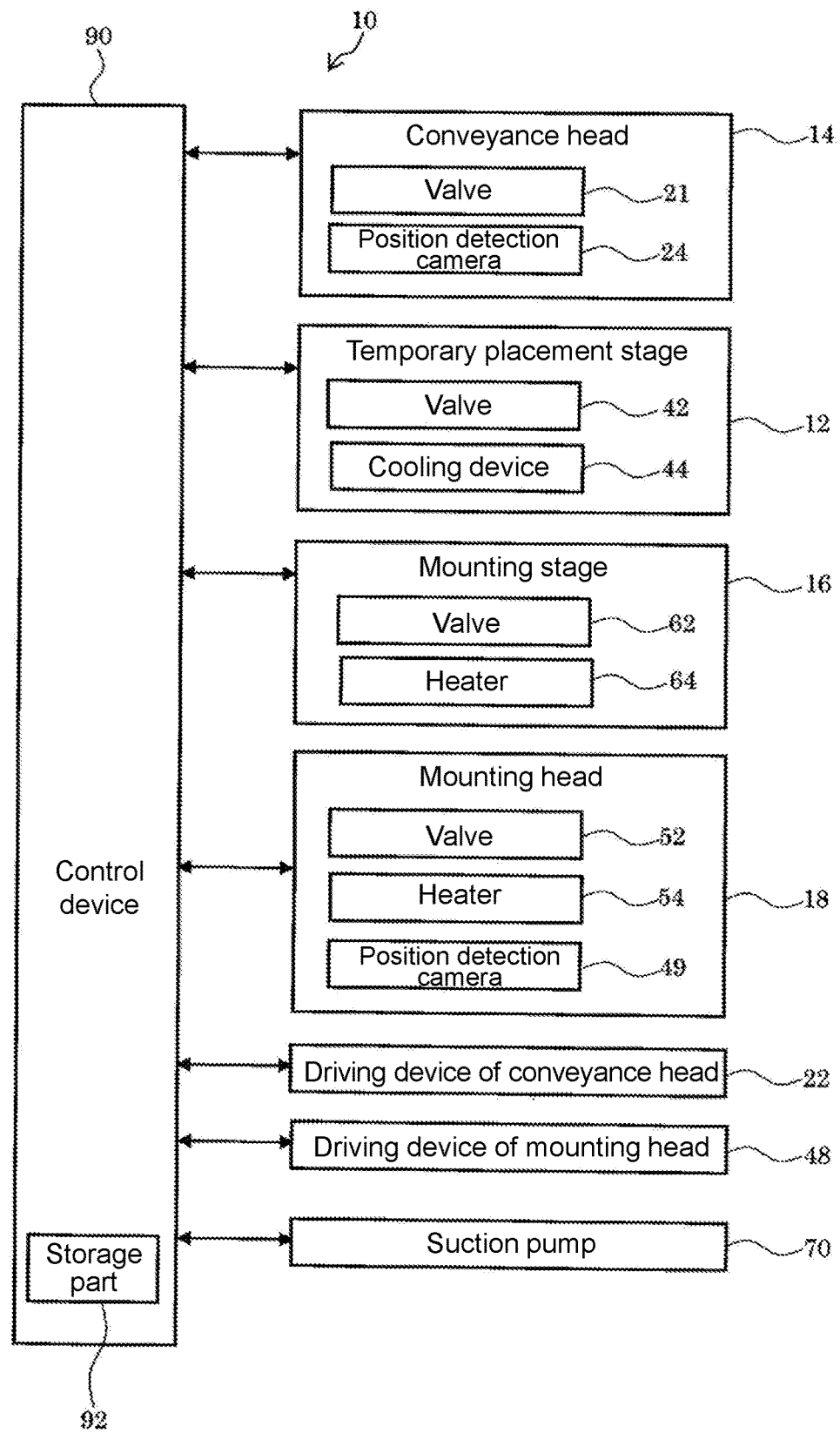
FIG. 2 is a block diagram showing a control configuration of the semiconductor mounting device.

FIG. 1 is a schematic view showing an overall configuration of the semiconductor mounting device 10 of the present embodiment, and FIG. 2 is a block diagram showing a control configuration of the semiconductor mounting device 10 of the present embodiment. The semiconductor mounting device 10 is a device that pressurizes and heats a plurality of chip components 30a, 30b, and 30c, which are semiconductor elements, at predetermined positions on a substrate 36 simultaneously so as to mount the chip components 30a, 30b, and 30c on the substrate 36, and the semiconductor mounting device 10 is a multi-chip bonding apparatus. In the present embodiment, a non-conductive film (NCF) composed of a thermosetting resin, which is an adhesive, is attached to the lower surfaces of the chip components 30a, 30b, and 30c. The semiconductor mounting device 10 pressurizes and heats each of the chip components 30a, 30b, and 30c to harden the NCF and bond each of the chip components 30a, 30b, and 30c to the substrate 36, and bonds a bump 32 (see FIG. 3) provided on each of the chip components 30a, 30b, and 30c to a pad 38 (see FIG. 8) formed on the substrate 36. Thereby, each of the chip components 30a, 30b, and 30c is secured to the substrate 36.

The semiconductor mounting device 10 includes a conveyance head 14 that conveys the chip components 30a, 30b, and 30c one by one; a temporary placement stage 12 on which the chip components 30a, 30b, and 30c (a plurality of chip components) conveyed by the conveyance head 14 are loaded; a mounting stage 16 that secures the substrate 36, which is a circuit substrate, by suction; a mounting head 18 that carries the plurality of chip components 30a, 30b, and 30c loaded on the temporary placement stage 12 above the substrate 36 on the mounting stage 16 and simultaneously secures the chip components 30a, 30b, and 30c to the substrate 36; and a control device 90 (see FIG. 2). The plurality of chip components 30a, 30b, and 30c secured simultaneously by the mounting head 18 have a predetermined combination, and constitute one chip component set 34.

The conveyance head 14 is provided with suction holes, which are connected to a suction pump 70 (see FIG. 2) via a pipe and a valve 21 (see FIG. 2), on the lower surface. The conveyance head 14 is moved by a driving device 22 (see FIG. 2) in a left-right direction (X-axis direction in FIG. 1), a front-rear direction (Y-axis direction in FIG. 1), and a vertical direction (Z-axis direction in FIG. 1) to suction the chip components 30a, 30b, and 30c stored in a tray or the like (not shown) one by one, and sequentially convey and load the chip components 30a, 30b, and 30c on the temporary placement stage 12. Thereby, the chip components 30a, 30b, and 30c are loaded as the chip component set 34 on the temporary placement stage 12. At this time, the chip components 30a, 30b, and 30c are loaded on the temporary placement stage 12 so that the chip components 30a, 30b, and 30c constituting the chip component set 34 are at predetermined relative positions. Here, the predetermined relative positions refer to relative positions when the chip components 30a, 30b, and 30c constituting the chip component set 34 are secured to the substrate 36.

The conveyance head 14 includes a position detection camera 24. The position detection camera 24 is used when the chip component set 34 is loaded on the temporary placement stage 12, and captures an image of the temporary placement stage 12 and the chip components that have been loaded on the temporary placement stage 12.

The temporary placement stage 12 is a stage on which each of the chip components 30a, 30b, and 30c constituting the chip component set 34 is positioned by suction. The temporary placement stage 12 includes a porous member 40 and a cooling device 44 (see FIG. 3). The porous member 40 is a first porous member that forms the upper surface of the temporary placement stage 12. The porous member 40 is a flat plate-shaped member having suction holes 41 (see FIG. 4) uniformly on the upper surface thereof, and is, for example, ceramics. The lower surface of the porous member 40 is connected to the suction pump 70 (see FIG. 2) via a pipe and a valve 42, and by opening the valve 42, air is sucked through the suction holes 41 of the porous member 40, and the chip components 30a, 30b, and 30c are vacuum-suctioned to the upper surface of the porous member 40. The cooling device 44 (see FIG. 3) is provided on the lower side of the porous member 40 and cools the upper surface of the porous member 40. The details will be described later.

The mounting stage 16 is a stage that holds the substrate 36. The mounting stage 16 includes a heater 64 (see FIG. 8) inside. A plurality of suction holes are provided on the upper surface of the mounting stage 16, and these suction holes are connected to the suction pump 70 (see FIG. 2) via a pipe and a valve 62. When the valve 62 is opened, air above the upper surface of the mounting stage 16 is sucked toward the lower side, and the substrate 36 is secured to the upper surface of the mounting stage 16 by suction. The heater 64 is turned on when the chip components 30a, 30b, and 30c are secured to the substrate 36 by the mounting head 18, and heats the chip components 30a, 30b, and 30c and the substrate 36 from the lower side. The heating of the heater 64 promotes the hardening of the NCF attached to the lower surface of each chip component 30 and the bonding between the bump 32 provided on each chip component 30 and the pad 38 formed on the substrate 36.

The mounting head 18 suctions the plurality of chip components 30a, 30b, and 30c loaded on the temporary placement stage 12 as the chip component set 34 simultaneously, conveys the chip components 30a, 30b, and 30c onto the substrate 36 on the mounting stage 16, and secures the chip components 30a, 30b, and 30c at the predetermined positions on the substrate 36 simultaneously by pressurizing and heating. The mounting head 18 is moved by a driving device 48 (see FIG. 2) in the left-right direction (X-axis direction in FIG. 1), the front-rear direction (Y-axis direction in FIG. 1), and the vertical direction (Z-axis direction in FIG. 1).

The mounting head 18 includes a porous member 50, a heater 54 (see FIG. 8), and a position detection camera 49. The porous member 50 is a second porous member that forms the lower surface (suction surface) of the mounting head 18. The porous member 50 is a flat plate-shaped member having suction holes 51 (see FIG. 6) uniformly on the lower surface thereof, and is, for example, ceramics. The upper surface of the porous member 50 is connected to the suction pump 70 via a pipe and a valve 52, and by opening the valve 52, air is sucked through the suction holes 51 of the porous member 50, and the chip components 30a, 30b, and 30c are vacuum-suctioned as the chip component set 34 to the lower surface of the porous member 50. The heater 54 is turned on when the chip component set 34 is secured to the substrate 36, and heats the chip component set 34 from the upper side. Thereby, the NCF provided on the lower surface of each of the chip components 30a, 30b, and 30c constituting the chip component set 34 is hardened to bond each of the chip components 30a, 30b, and 30c to the substrate 36, and the bump 32 provided on each of the chip components 30a, 30b, and 30c and the pad 38 formed on the substrate 36 are bonded.

The position detection camera 49 is used when the chip component set 34 is secured to the substrate 36, and captures an image of each pad 38 (see FIG. 8) formed on the substrate 36.

The control device 90 (see FIG. 2) controls the conveyance head 14, the temporary placement stage 12, the mounting stage 16, the mounting head 18, the driving device 22 of the conveyance head 14, the driving device 48 of the mounting head 18, the valves 21, 42, 52, and 62, the position detection cameras 24 and 49, the cooling device 44, the heaters 54 and 64, and the suction pump 70. The control device 90 includes a processor such as a CPU, and controls each device by executing a control program stored in a storage part 92 in advance.

As shown in FIG. 1, the conveyance head 14 is arranged to be movable between the tray or the like (not shown) in which the chip components 30a, 30b, and 30c are stored and the temporary placement stage 12. In addition, the mounting head 18 is arranged to be movable between the temporary placement stage 12 and the mounting stage 16.

Figure 3:
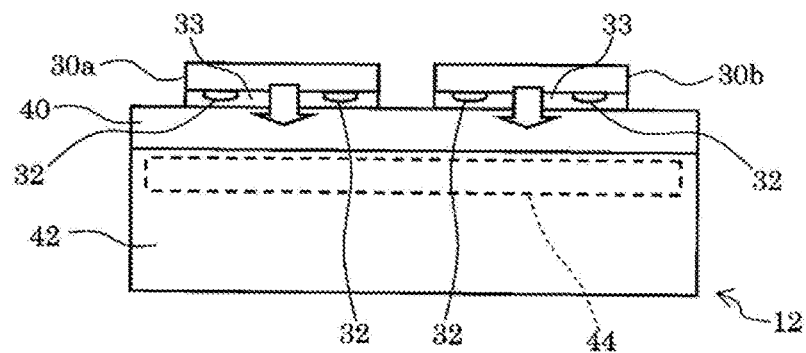
FIG. 3 is a side view showing a state where chip components are vacuum-suctioned to a temporary placement stage.

Next, an outline of an operation of the semiconductor mounting device 10 of the present embodiment will be described. The following operation is executed by a command of the control device 90. The control device 90 opens the valve 21 of the conveyance head 14, suctions the chip component 30a to the conveyance head 14, and conveys the chip component 30a onto the temporary placement stage 12 by the driving device 22 (see FIG. 1). Then, as shown in FIG. 3, the control device 90 closes the valve 21 of the conveyance head 14, and opens the valve 42 of the temporary placement stage 12 to load the chip component 30a on the upper surface of the porous member 40 of the temporary placement stage 12. The chip component 30a loaded on the upper surface of the porous member 40 is vacuum-suctioned onto the porous member 40.

Next, the control device 90 vacuum-suctions the chip components 30b and 30c to the upper surface of the porous member 40 of the temporary placement stage 12 by similar processes. At this time, the control device 90 checks the position of the chip component 30a with the position detection camera 24, adjusts the position of the conveyance head 14 with the driving device 22 so that the relative position of the chip component 30b relative to the chip component 30a reaches the relative position when the chip component 30b is secured to the substrate 36, and vacuum-suctions the chip component 30b to the upper surface of the porous member 40 of the temporary placement stage 12. Further, similarly, the chip component 30c is vacuum-suctioned to the upper surface of the porous member 40 of the temporary placement stage 12 so that the relative position of the chip component 30c relative to the chip components 30a and 30b reaches the relative position when the chip component 30c is secured to the substrate 36. Thereby, on the upper surface of the porous member 40 of the temporary placement stage 12, the chip components 30a, 30b, and 30c constituting the chip component set 34 are vacuum-suctioned at the relative positions when the chip components 30a, 30b, and 30c are secured to the substrate 36.

Figure 5:
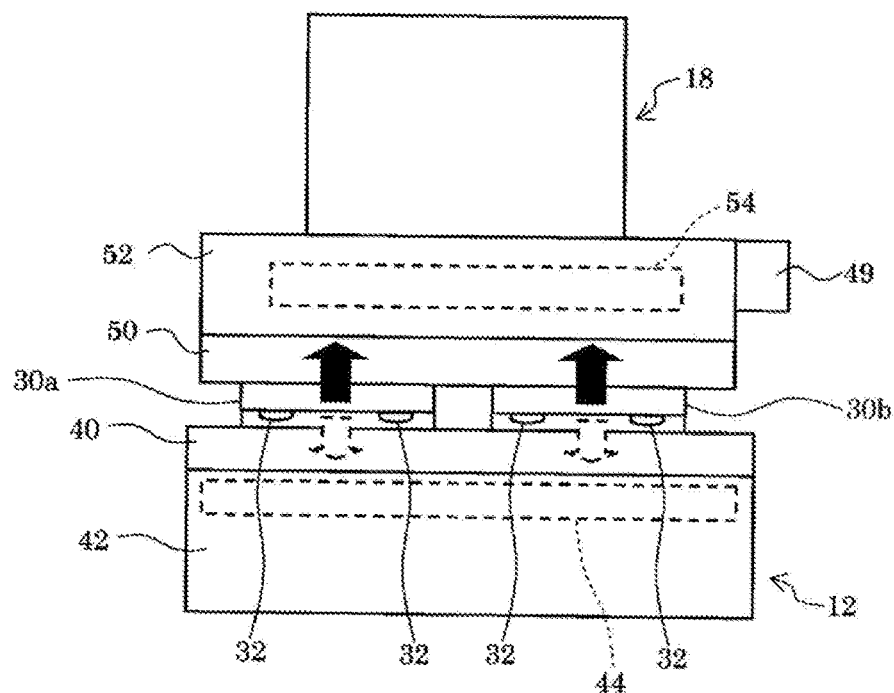
FIG. 5 is a side view showing a state where a mounting head is on an upper surface of each chip component on the temporary placement stage.
Figure 7:
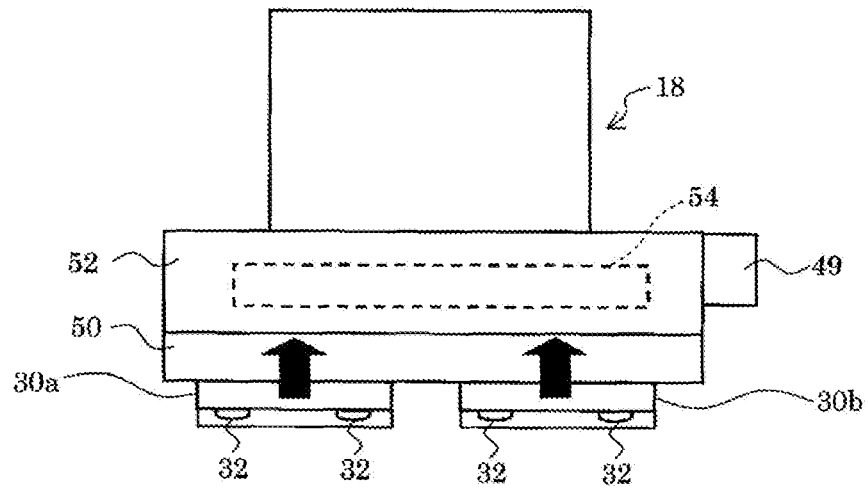
FIG. 7 is a side view showing a state where the chip component is vacuum-suctioned to the mounting head.

Next, as shown in FIG. 5, the control device 90 moves the mounting head 18 to a position above the temporary placement stage 12 and lowers the mounting head 18 toward the upper surface of the temporary placement stage 12 with the driving device 48. Then, the control device 90 opens the valve 52 of the mounting head 18 and closes the valve 42 of the temporary placement stage 12 when the porous member 50 of the mounting head 18 contacts the chip components 30a, 30b, and 30c, and as shown in FIG. 7, the control device 90 picks up the chip components 30a, 30b, and 30c by suctioning the chip components 30a, 30b, and 30c as the chip component set 34 to the lower surface of the porous member 50. Thereby, the chip components 30a, 30b, and 30c constituting the chip component set 34 are simultaneously vacuum-suctioned to the porous member 50 of the mounting head 18 at the relative positions when the chip components 30a, 30b, and 30c are secured to the substrate 36.

Figure 8:
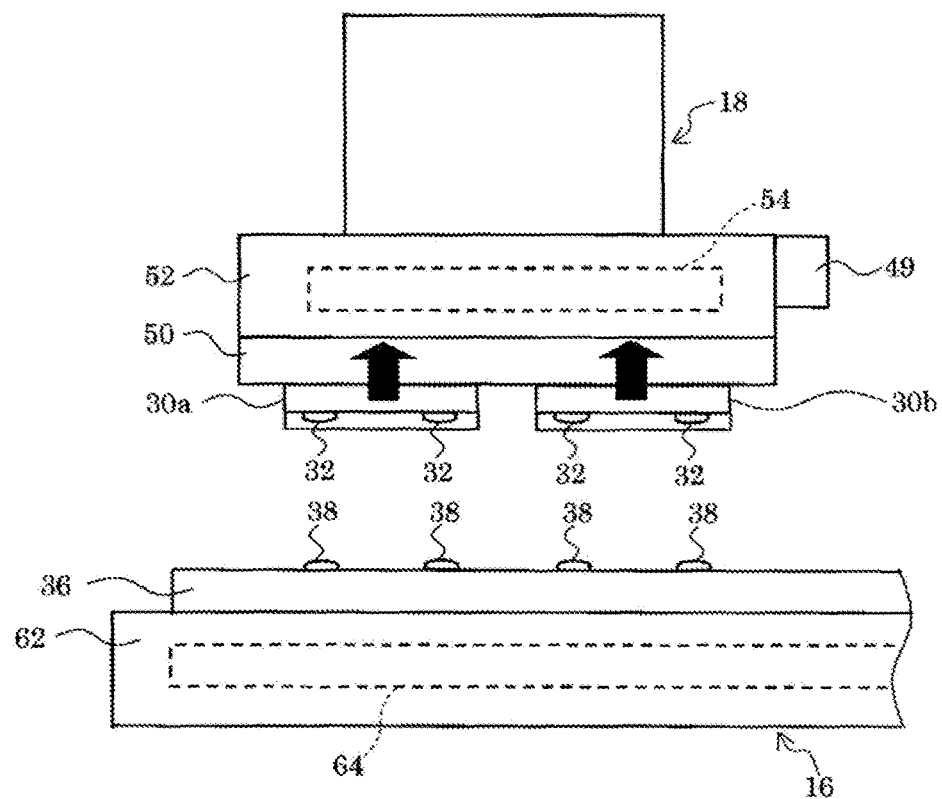
FIG. 8 is a side view showing a state where the mounting head vacuum-suctioning the chip component is above a substrate.

As shown in FIG. 8, the control device 90 moves the mounting head 18 to a position above the mounting stage 16 with the driving device 48. Then, the control device 90 turns on the heater 54 of the mounting head 18 to heat the chip components 30a, 30b, and 30c, and lowers the mounting head 18 to a predetermined position on the substrate 36 on the mounting stage 16 while checking the position of the pad 38 on the substrate 36 with the position detection camera 49. At this time, the control device 90 turns on the heater 64 of the mounting stage 16 to heat the mounting stage 16.

Figure 9:
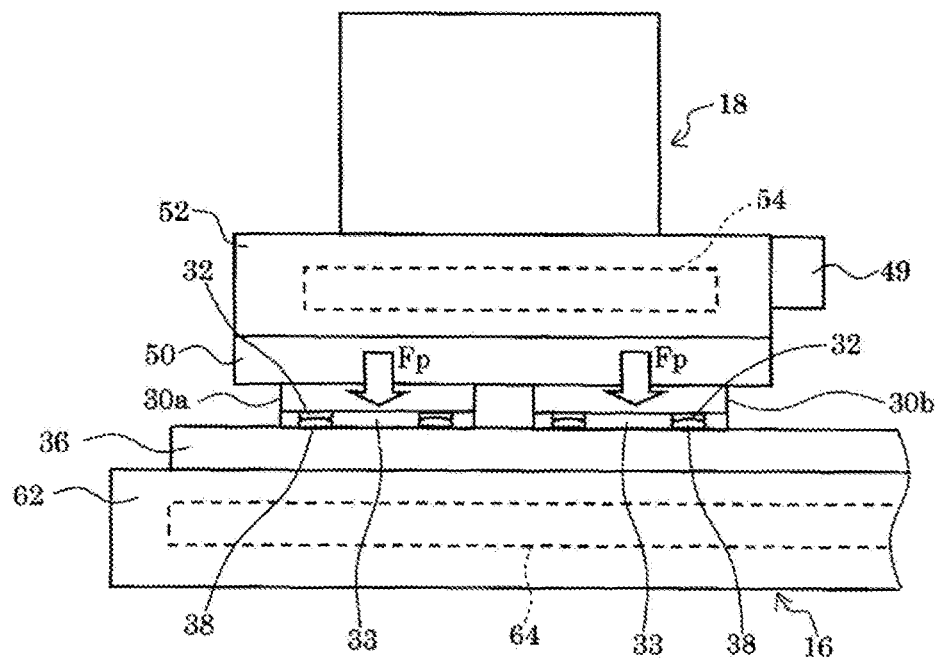
FIG. 9 is a side view showing a state where the chip component is secured to the substrate by the mounting head.

As shown in FIG. 9, the control device 90 applies pressure Fp and heats the chip components 30a, 30b, and 30c suctioned to the mounting head 18 simultaneously at the predetermined position on the substrate 36 to secure the chip components 30a, 30b, and 30c to the substrate 36. Specifically, the NCF 33 attached to the lower surface of each of the chip components 30a, 30b, and 30c is hardened to bond each of the chip components 30a, 30b, and 30c to the substrate 36, and the bump 32 provided on each of the chip components 30a, 30b, and 30c is bonded to the pad 38 formed on the substrate 36. The control device 90 mounts a plurality of chip component sets 34 on the substrate 36 by repeating the above-described operation.

Since the semiconductor mounting device 10 of the present embodiment has one stage for holding the substrate 36 and one head for mounting the chip components on the substrate 36, the semiconductor mounting device 10 has the features that the device configuration is very simple and the device is very small in size. Furthermore, in the semiconductor mounting device 10 of the present embodiment, while the mounting head 18 is securing one chip component set 34 to the substrate 36, the conveyance head 14 can convey the chip components 30a, 30b, and 30c constituting the next chip component set 34 to the temporary placement stage 12 (parallel processing is possible) so the productivity is also very high.

Next, the semiconductor mounting device 10 of the present embodiment will be described in more detail. In the storage part 92 of the control device 90, "configuration information of chip component set" indicating how the chip components are combined to constitute the chip component set 34, "relative position information of chip component set" indicating the relative positions of the chip components 30a, 30b, and 30c constituting the chip component set 34 (the relative positions when the chip components 30a, 30b, and 30c are secured to the substrate 36), and "secured position information of chip component set" indicating the secured position of the chip component set 34 on the substrate 36 are stored in advance. The relative position information of the chip component set 34 is, for example, information indicating the direction and distance of one chip component (for example, chip component 30a) relative to another chip component (for example, chip component 30b) in the chip component set 34. The control device 90 reads these from the storage part 92 to control each device.

As shown in FIG. 1, the conveyance head 14 sequentially loads the chip components 30a, 30b, and 30c constituting the chip component set 34 on the temporary placement stage 12 one by one. At this time, the control device 90 reads "configuration information of chip component set" and "relative position information of chip component set" from the storage part 92. In addition, the control device 90 captures an image of the temporary placement stage 12 by using the position detection camera 24 of the conveyance head 14, and specifies the position of the temporary placement stage 12. Then, the control device 90 uses "configuration information of chip component set", "relative position information of chip component set", and the specified position of the temporary placement stage 12 to determine the position at which the first chip component 30a of the chip component set 34 is to be placed on the temporary placement stage 12. Specifically, the position at which the first chip component 30a is to be placed is determined in consideration of the space for loading the other chip components 30b and 30c of the chip component set 34 on the temporary placement stage 12. Then, the control device 90 controls the conveyance head 14 and the driving device 22 of the conveyance head 14 to place the first chip component 30a at the determined position. Next, the position detection camera 24 of the conveyance head 14 is used to capture an image of the chip component 30a already loaded on the temporary placement stage 12, and the position of the chip component 30a is specified. Then, the control device 90 uses "configuration information of chip component set", "relative position information of chip component set", and the specified position of the loaded chip component 30a to determine the position at which the next chip component 30b is to be placed on the temporary placement stage 12. Then, the control device 90 controls the conveyance head 14 and the driving device 22 of the conveyance head 14 to place the next chip component 30b at the determined position. In this manner, each of the chip components 30a, 30b, and 30c of the chip component set 34 is loaded on the temporary placement stage 12. Nevertheless, the above method is an example, and the chip components 30a, 30b, and 30c of the chip component set 34 may be loaded on the temporary placement stage 12 by a method other than the above.

FIG. 3 is a side view showing a state where the chip components 30a, 30b, and 30c are loaded on the temporary placement stage 12. FIG. 3 shows only the chip components 30a and 30b. As shown in FIG. 3, the bumps 32 are respectively provided on the lower surfaces of the chip components 30a, 30b, and 30c. In addition, the NCF 33 which is an adhesive is attached to the lower surface of each of the chip components 30a, 30b, and 30c. Each of the chip components 30a, 30b, and 30c is loaded on the temporary placement stage 12 with the side to which the NCF 33 is attached as the lower side. The valve 42 of the temporary placement stage 12 is opened by the control device 90, and the loaded chip components 30a, 30b, and 30c are suctioned to the upper surface of the porous member 40 of the temporary placement stage 12.

Figure 4:
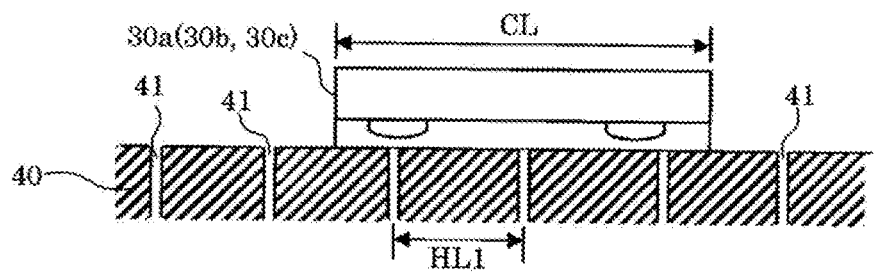
FIG. 4 is a view showing a cross section of a porous member of the temporary placement stage and a side surface of the chip component.

FIG. 4 is a view showing a cross section of the porous member 40 of the temporary placement stage 12 and a side surface of one chip component 30a (30b, 30c). As shown in FIG. 4, an interval HL1 between the suction holes 41 on the upper surface of the porous member 40 is set shorter than a length CL of one side of the chip component 30a (30b, 30c) that can be suctioned to the temporary placement stage 12. Thereby, even if the combination of the chip components 30a, 30b, and 30c constituting the chip component set 34 is changed or the relative positions of the chip components 30a, 30b, and 30c of the chip component set 34 are changed, each of the chip components 30a, 30b, and 30c can still be suctioned to the temporary placement stage 12.

FIG. 5 is a side view showing a state where the mounting head 18 is on the upper surface of each of the chip components 30a, 30b, and 30c on the temporary placement stage 12. FIG. 5 shows only the chip components 30a and 30b. The control device 90 controls the driving device 48 of the mounting head 18 to move the mounting head 18 to the upper surface of each of the chip components 30a, 30b, and 30c on the temporary placement stage 12, and opens the valve 52 of the mounting head 18. Thereby, the chip components 30a, 30b, and 30c are suctioned to the suction surface of the mounting head 18 (the lower surface of the porous member 50). Then, the control device 90 closes the valve 42 of the temporary placement stage 12 to set the suction force of the temporary placement stage 12 to zero. Then, the mounting head 18 is moved to the upper side to pick up the chip components 30a, 30b, and 30c.

As shown in FIG. 5, the cooling device 44 is provided in the temporary placement stage 12. The cooling device 44 has, for example, a pipe that is piped uniformly on the lower side of the porous member 40, and cools the porous member 40 by circulating a refrigerant therein. The reason for providing the cooling device 44 is as follows. As shown in FIG. 5, the mounting head 18 includes the heater 54, and the heater 54 is turned on when the chip components 30a, 30b, and 30c are secured to the substrate 36 on the mounting stage 16. Although the heater 54 is turned off when the mounting head 18 suctions the chip components 30a, 30b, and 30c on the temporary placement stage 12, residual heat may remain on the lower surface of the mounting head 18. In that case, when the mounting head 18 suctions the chip components 30a, 30b, and 30c on the temporary placement stage 12, the residual heat of the mounting head 18 may be transmitted to the chip components 30a, 30b, and 30c, and the NCF of each of the chip components 30a, 30b, and 30c may be softened and adhere to the upper surface of the temporary placement stage 12. Therefore, by providing the cooling device 44 in the temporary placement stage 12 to cool the upper surface of the temporary placement stage 12 (the upper surface of the porous member 40), the NCF of each of the chip components 30a, 30b, and 30c is prevented from being softened. If no residual heat remains on the lower surface of the mounting head 18, the cooling device 44 may not be provided. In addition, instead of providing the cooling device 44, the control device 90 may open the valve 42 of the temporary placement stage 12 even when the chip components 30a, 30b, and 30c are not loaded on the temporary placement stage 12, so as to suck air through the suction holes 41 of the porous member 40 to cool the upper surface of the porous member 40.

Figure 6:
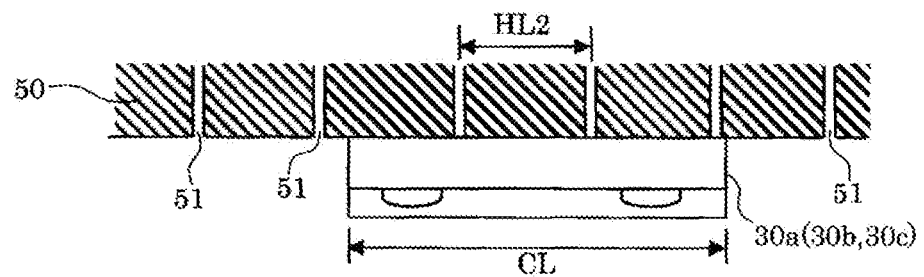
FIG. 6 is a view showing a cross section of a porous member of the mounting head and the side surface of the chip component.

FIG. 6 is a view showing a cross section of the porous member 50 of the mounting head 18 and the side surface of one chip component 30a (30b, 30c). As shown in FIG. 6, similar to the porous member 40 of the temporary placement stage 12, an interval HL2 between the suction holes 51 on the lower surface of the porous member 50 of the mounting head 18 is set shorter than the length CL of one side of the chip component 30a (30b, 30c) that can be suctioned to the mounting head 18. Thereby, similar to the temporary placement stage 12, even if the combination of the chip components 30a, 30b, and 30c constituting the chip component set 34 is changed or the relative positions of the chip components 30a, 30b, and 30c of the chip component set 34 are changed, each of the chip components 30a, 30b, and 30c can still be suctioned to the mounting head 18.

FIG. 7 is a side view showing a state where the chip component set 34 (the chip components 30a, 30b, and 30c) is picked up by the mounting head 18. FIG. 7 shows only the chip components 30a and 30b. The control device 90 controls the driving device 48 of the mounting head 18 and moves the mounting head 18 toward the mounting stage 16 in a state where the chip components 30a, 30b, and 30c are suctioned to the lower surface (suction surface) of the mounting head 18. Then, the control device 90 reads "secured position information of chip component set" from the storage part 92 and moves the mounting head 18 to a position above the secured position of the chip component set 34 on the substrate 36 on the mounting stage 16.

FIG. 8 is a side view showing a state where the mounting head 18 suctioning the chip component set 34 (the chip components 30a, 30b, and 30c) is located above the substrate 36 on the mounting stage 16. FIG. 8 shows only the chip components 30a and 30b. The control device 90 uses the position detection camera 49 provided on the mounting head 18 to capture an image of each pad 38 on the substrate 36, to which each bump 32 of each of the chip components 30a, 30b, and 30c suctioned to the mounting head 18 is bonded. At this time, the control device 90 adjusts the position of the mounting head 18 so that the pad 38 formed on the substrate 36 comes under the position detection camera 49. Then, the control device 90 specifies the position of each pad 38 from each imaged pad 38, and adjusts the position of the mounting head 18 so that the position of each bump 32 of each of the chip components 30a, 30b, and 30c is aligned with the position of each pad 38 on the substrate 36. The mounting head 18 may not be provided with the position detection camera 49, or the mounting head 18 may be provided with the position detection camera 49 and a vertical dual-view camera for aligning the positions of each bump 32 of each of the chip components 30a, 30b, and 30c and each pad 38 on the substrate 36. That is, in the state shown in FIG. 8, the vertical dual-view camera may be inserted between the chip components 30a, 30b, and 30c and the substrate 36 to capture images of each bump 32 of each of the chip components 30a, 30b, and 30c and each pad 38 on the substrate 36 and specify the positions for position alignment.

When the position alignment is completed, the control device 90 controls the driving device 48 of the mounting head 18 to lower the mounting head 18 and pressurize the chip components 30a, 30b, and 30c constituting the chip component set 34 against the substrate 36 while keeping the relative positions. Further, the control device 90 turns on the heater 54 of the mounting head 18 and the heater 64 of the mounting stage 16, and heats the chip components 30a, 30b, and 30c constituting the chip component set 34. FIG. 9 is a side view showing a state where the chip components 30a, 30b, and 30c are pressurized and heated on the substrate 36 by the mounting head 18. Since the mounting head 18 pressurizes the chip components 30a, 30b, and 30c against the substrate 36 with the pressure Fp while suctioning the chip components 30a, 30b, and 30c, displacement of the chip components 30a, 30b, and 30c on the substrate 36 can be suppressed. The NCF 33 is hardened by the pressurization and heating, and the chip components 30a, 30b, and 30c are bonded to the substrate 36, and each bump 32 of each of the chip components 30a, 30b, and 30c is bonded to each pad 38 on the substrate 36.

As the semiconductor mounting device 10 of the present embodiment described above has one stage for holding the substrate 36 and one head for mounting the chip components 30a, 30b, and 30c on the substrate 36, the device configuration is simple and the size of the device can be reduced. In addition, while the mounting head 18 is securing the chip component set 34 to the substrate 36 over, for example, several tens of seconds, the conveyance head 14 can relatively position the next chip component set 34 and prepare the next chip component set 34 on the temporary placement stage 12. Therefore, the productivity is also high. The clean room for installing the semiconductor mounting device 10 requires a high maintenance cost per unit area, and it is strongly desired to increase the productivity per unit area. The semiconductor mounting device 10 of the present embodiment meets such demand.

In the related art (Patent Document 1), a plurality of chip components temporarily pressure-bonded to the entire surface of the circuit substrate are pressurized and heated block by block to perform the final pressure-bonding. Therefore, as the chip components of one block are being heated, the temperature of the NCF (NCF before curing) of the adjacent chip components that have not been fully pressure-bonded may rise to a transformation start temperature, for example, about 150° C., and the NCF may transform before the final pressure bonding, which causes a problem in the final pressure bonding. In contrast thereto, the semiconductor mounting device 10 of the present embodiment mounts one chip component set 34 and completes the curing of the NCF, and then mounts the next chip component set 34. Therefore, the NCF before curing does not rise to the transformation start temperature. In addition, after the curing is completed, the NCF does not transform even if the temperature rises to the transformation start temperature. Therefore, when the adjacent chip component set 34 is mounted, the NCF of the chip component set 34 that has already been mounted is not affected. Thus, in the semiconductor mounting device 10 of the present embodiment, many chip component sets 34 can be mounted on the substrate 36 in a short time while the NCF before curing is suppressed from rising to the transformation start temperature or above.

The semiconductor mounting device 10 of the present embodiment described above is a flip chip bonding apparatus. However, the semiconductor mounting device 10 may be a die bonding apparatus. In that case, the conveyance head 14 conveys the chip component that has not been inverted, and loads the chip component on the temporary placement stage 12. In addition, in that case, the mounting head 18 and the mounting stage 16 may not be provided with the heaters 54 and 64, and the chip component set 34 may be secured to the substrate 36 only by pressurization. For example, an adhesive may be applied in advance to a position on the substrate 36 at which each of the chip components 30a, 30b, and 30c is to be secured, and the mounting head 18 may secure the chip components 30a, 30b, and 30c to the substrate 36 by pressurizing the chip components 30a, 30b, and 30c at these positions.

Further, although the semiconductor mounting device 10 of the present embodiment described above loads one chip component set 34 on the temporary placement stage 12, a plurality of chip component sets 34 may be loaded.

Furthermore, in the semiconductor mounting device 10 of the present embodiment described above, the chip component set 34 includes three chip components 30a, 30b, and 30c. However, the chip component set 34 may include more or fewer chip components. For example, the number of the chip components that constitute the chip component set 34 may be determined according to the size of the temporary placement stage 12 that can be prepared. Also, the number may be determined so that the time required for the mounting head 18 to secure one chip component set 34 is the same as the time required for the conveyance head 14 to convey one chip component set 34 to the temporary placement stage 12. In that case, since the idle time between the conveyance head 14 and the mounting head 18 is eliminated, the productivity can be significantly increased.

What is claimed is:

1. A mounting device mounting a chip component on a substrate, the mounting device comprising:
   a temporary placement stage on which a plurality of the chip components are loaded;
   a conveyance head conveying the chip component to the temporary placement stage, and loading each chip component on the temporary placement stage so that relative positions of the plurality of chip components reach predetermined positions;
   a mounting stage securing the substrate by suction; and
   a mounting head suctioning a chip component set which is the plurality of chip components loaded on the temporary placement stage, and pressurizing and securing while keeping the relative positions at the predetermined positions on the substrate that is secured by suction to the mounting stage,
   wherein while the mounting head is securing the chip component set to the substrate, the conveyance head loads a plurality of the chip components constituting a chip component set which is scheduled to be secured to the substrate next on the temporary placement stage, and
   a number of the chip components constituting the chip component set is determined so that after the mounting head secures the chip component set to the substrate, while the mounting head moves toward the temporary placement stage in order to suction the chip component set scheduled to be secured next, loading of the chip component set on the temporary placement stage performed by the conveyance head is completed.

2. The mounting device according to claim 1, wherein the temporary placement stage has an upper surface vacuum-suctioning the chip component,
   the upper surface is formed of a first porous member, and
   the first porous member comprises suction holes at an interval shorter than a length of each side of the chip component loaded on the upper surface.

3. The mounting device according to claim 2, wherein the mounting head has a suction surface vacuum-suctioning the plurality of chip components,
   the suction surface is formed of a second porous member, and
   the second porous member comprises suction holes at an interval shorter than the length of each side of each chip component suctioned to the suction surface.

4. The mounting device according to claim 1, wherein the mounting head has a suction surface vacuum-suctioning the plurality of chip components,
   the suction surface is formed of a second porous member, and
   the second porous member comprises suction holes at an interval shorter than the length of each side of each chip component suctioned to the suction surface.

* * * * *